(12) United States Patent
Hanaoka et al.

(10) Patent No.: US 9,640,920 B2
(45) Date of Patent: May 2, 2017

(54) PROTECTIVE COVER STRUCTURE

(71) Applicant: YAZAKI CORPORATION, Tokyo (JP)

(72) Inventors: Kiyotaka Hanaoka, Kakegawa (JP); Takanori Kanamori, Kakegawa (JP); Takuomi Wada, Kakegawa (JP)

(73) Assignee: YAZAKI CORPORATION, Tokyo (JP)

( * ) Notice: Subject to any disclaimer, the term of this patent is extended or adjusted under 35 U.S.C. 154(b) by 234 days.

(21) Appl. No.: 14/444,298

(22) Filed: Jul. 28, 2014

(65) Prior Publication Data

US 2015/0035552 A1 Feb. 5, 2015

(30) Foreign Application Priority Data

Jul. 30, 2013 (JP) .................. 2013-157318

(51) Int. Cl.
*G01R 27/08* (2006.01)
*H01R 13/66* (2006.01)
(Continued)

(52) U.S. Cl.
CPC ......... *H01R 13/6683* (2013.01); *G01R 27/02* (2013.01); *H01R 13/405* (2013.01);
(Continued)

(58) Field of Classification Search
CPC H01R 13/005; H01R 13/405; H01R 13/5213; H01R 13/648; H01R 13/6683; H01R 13/707; H01R 13/74; H01R 13/743; H01R 13/745; H01R 13/748; H01R 13/447; H01R 13/52; H01R 13/5202; H01R 13/5205; H01R 13/5208; H01R 13/5219;
(Continued)

(56) References Cited

U.S. PATENT DOCUMENTS 7,094,098 B2 * 8/2006 Miyazaki ................. H01R 4/46
439/550
2004/0161961 A1 * 8/2004 Endo .................... H01R 13/631
439/374
(Continued)

FOREIGN PATENT DOCUMENTS

JP 2011-124062 A 6/2011

*Primary Examiner* — Arleen M Vazquez
*Assistant Examiner* — Steven Yeninas
(74) *Attorney, Agent, or Firm* — Sughrue Mion, PLLC

(57) ABSTRACT

A protective cover structure includes a protective cover that is fitted to an assembly work opening disposed in a wall of a case in which electric components are accommodated, thereby closing the opening, and a fitting detecting connector that detects that the protective cover is fitted to the assembly work opening. The fitting detecting connector includes a receptacle connector which is fixed to an interior of the case and an insertion/extraction connector which is disposed on the protective cover in a mutually insertable/extractable manner while being opposed to the receptacle connector. The receptacle connector includes a tubular housing and fitting detecting conductors in the tubular housing. The insertion/extraction connector holds a pair of detecting electrodes which are electrically conductible with the fitting detecting conductors, and is molded integrally with the protective cover.

2 Claims, 3 Drawing Sheets

(51) Int. Cl.
*H01R 13/453* (2006.01)
*H01R 13/70* (2006.01)
*H01R 13/447* (2006.01)
*G01R 27/02* (2006.01)
*H05K 5/03* (2006.01)
*H01R 13/405* (2006.01)
*H01R 13/52* (2006.01)
*H01R 13/707* (2006.01)
*H01R 31/00* (2006.01)
*H05K 5/06* (2006.01)
*H01R 13/74* (2006.01)

(52) U.S. Cl.
CPC ....... *H01R 13/447* (2013.01); *H01R 13/4538* (2013.01); *H01R 13/5213* (2013.01); *H01R 13/701* (2013.01); *H01R 13/707* (2013.01); *H01R 31/005* (2013.01); *H05K 5/03* (2013.01); *H05K 5/069* (2013.01); *H01R 13/748* (2013.01)

(58) Field of Classification Search
CPC .... H01R 13/64; H01R 13/641; H01R 13/665; H01R 31/005; G01R 27/02; G01R 1/0416; G01R 31/043; G01R 31/045; H05K 5/03; H05K 5/069
USPC ........ 324/538, 691; 439/278, 521, 550, 559, 439/607.28, 607.34, 607.44, 607.53, 439/607.58, 620.21, 682, 686, 689, 709, 439/891, 948, 271, 668, 669, 675
See application file for complete search history.

(56) References Cited

U.S. PATENT DOCUMENTS

| | | | |
|---|---|---|---|
| 2008/0274635 A1* | 11/2008 | Shirai ................ | H01R 13/5219 439/271 |
| 2009/0093157 A1* | 4/2009 | Aoki .................... | H01R 13/648 439/607.01 |
| 2010/0009566 A1* | 1/2010 | Sakakura ............... | H01R 4/302 439/364 |
| 2010/0112841 A1* | 5/2010 | Yong ...................... | H01R 13/74 439/271 |
| 2011/0189888 A1* | 8/2011 | Rhein ............... | H01R 13/65802 439/572 |
| 2012/0094537 A1* | 4/2012 | Aoki .................... | H01R 13/688 439/620.26 |
| 2012/0208395 A1* | 8/2012 | Fujiwara .............. | H01R 13/641 439/489 |
| 2014/0097015 A1* | 4/2014 | Suzuki .............. | H01R 13/6581 174/359 |
| 2015/0340816 A1* | 11/2015 | Abe .................... | H01R 13/6582 439/607.34 |

* cited by examiner

PROTECTIVE COVER STRUCTURE

CROSS REFERENCE TO RELATED APPLICATIONS

This application claims the benefit of Japanese Patent Application No. 2013-157318 filed on Jul. 30, 2013, the contents of which are incorporated herein by reference.

BACKGROUND

1. Technical Field

The present invention relates to a protective cover structure, and more specifically to a protective cover structure for closing an opening for assembly work which is formed in a wall of a case housing electric components.

2. Related Art

An electric device has been known in which, for the purpose of dustproof, waterproof, or electromagnetic wave shielding, electric components are accommodated in a case in which a dustproof, waterproof, or electromagnetic wave shielding structure is formed. For example, JP-A-2011-124062 discloses an electric device in which a driving electric power is supplied from an inverter to a motor for driving an electric vehicle. The device has a structure in which an opening for assembly work (hereinafter, referred to as an assembly work opening) is disposed in an electromagnetic wave shield case housing, for example, an inverter, and a work of fastening conductor terminals of a connector connected to the motor, to circuit conductors of the inverter is performed through the assembly work opening by using bolts and the like.

Particularly, the assembly work opening for fastening the conductor terminals of a connector to the circuit conductors of the inverter is relatively largely formed in consideration of workability. In view of safety, the assembly work opening must be closed by an insulative protective cover after the work is completed. In the device disclosed in JP-A-2011-124062, an interlock portion is disposed in a protective cover, and, after the protective cover is fitted to the assembly work opening, the inverter is allowed to start to operate by function of the interlock portion.

However, JP-A-2011-124062 fails to disclose in detail the configuration of the interlock portion. For example, the interlock portion may be configured so that a short-circuit pin is disposed on the inner side of the protective cover, a fitting detecting connector is disposed on the side of the case while being opposed to the short-circuit pin, and, when the protective cover is fitted to the assembly work opening, a fitting detecting circuit is closed by the short-circuit pin of the protective cover. It may be contemplated to configure an interlock mechanism in which the closing operation of the fitting detecting circuit causes a fitting detection signal to be produced, and the fitting detection signal is supplied to an inverter controller to start the operation of the inverter.

The fitting detection signal is transmitted through signal wires to the inverter controller. When the inverter controller is disposed in the shield case for the inverter, for example, the signal wires are laid in the shield case to be connected to the fitting detecting circuit. In the case where the inverter controller is disposed outside of the shield case, however, the signal wires must be drawn out from (or drawn into) the shield case, and therefore a hole through which the signal wires are to be passed must be formed in the shield case. In this case, therefore, measures such as waterproofing and dustproofing must be taken in the hole for the signal wires.

It is an object of the invention to simplify a structure relating to a draw-out hole for signal wires which are used for detecting that a protective cover is fitted to an assembly work opening of a case housing electric components.

SUMMARY

In order to solve the problem, the protective cover structure of the invention includes: a protective cover that is fitted to an assembly work opening disposed in a wall of a case in which electric components are to be accommodated, thereby closing the opening; and a fitting detecting connector which detects that the protective cover is fitted to the assembly work opening, the fitting detecting connector is configured by: a receptacle connector which is fixed to an interior of the case; and an insertion/extraction connector which is disposed on the protective cover in a mutually insertable/extractable manner while being opposed to the receptacle connector, the receptacle connector is formed by accommodating fitting detecting conductors in a tubular housing, and the insertion/extraction connector holds a pair of detecting electrodes which are electrically conductible with the fitting detecting conductors, and is molded integrally with the protective cover.

According to the invention, the fitting detecting connector which detects that the protective cover is fitted to the assembly work opening is divided into the receptacle connector and the insertion/extraction connector, the receptacle connector is accommodated in the tubular housing, and the insertion/extraction connector is disposed on the protective cover. When the protective cover is fitted to the assembly work opening while positioning the insertion/extraction connector with respect to the receptacle connector, therefore, the insertion/extraction connector is automatically fitted to the receptacle connector. As a result of this fitting, the pair of detecting electrodes of the insertion/extraction connector are electrically conductive with the fitting detecting connector of the receptacle connector, thereby causing the pair of detecting electrodes to be electrically conductive with each other. When signal wires are connected to the pair of detecting electrodes of the insertion/extraction connector, therefore, the wires can be easily drawn out to the outside through the protective cover fitted to the assembly work opening, without requiring formation of a hole for the signal wires in the wall of the case.

In this case, the insertion/extraction connector may include a housing in which the pair of detecting electrodes are held by a hood portion that is disposed by partitioning a tubular housing space in a longitudinal direction, and a pair of detecting terminals are accommodated, the detecting terminals being connected to the pair of detecting electrodes and drawn out from the hood portion, and the tubular portion of the insertion/extraction connector may be formed so that a signal wire connector which is detachably connected to the pair of detecting electrodes is insertable and extractable. According to the configuration, the case can be waterproofed and dustproofed by the hood portion of the insertion/extraction connector. The waterproofing and dustproofing of the portion where the protective cover is fitted to the assembly work opening may be performed by a packing.

According to the invention, it is possible to simplify a structure relating to a draw-out hole for signal wires which are used for detecting that a protective cover is fitted to an assembly work opening of a case housing electric components.

BRIEF DESCRIPTION OF THE DRAWINGS

FIG. 2A is a sectional view taken at the same point as FIG. 1, and FIG. 2B is a sectional view looking in the direction of the arrows IIb-IIb in FIG. 1.

FIG. 3A shows a state obtained before a protective cover is attached, and FIG. 3B shows a state where the protective cover is attached.

FIG. 4A shows a state obtained before the signal wire connector and a fitting detecting connector are fitted to each other, FIG. 4B shows a state where the connectors are fitted to each other, and FIG. 4C shows a section obtained after the connectors are fitted to each other.

DETAILED DESCRIPTION

Figure 1:
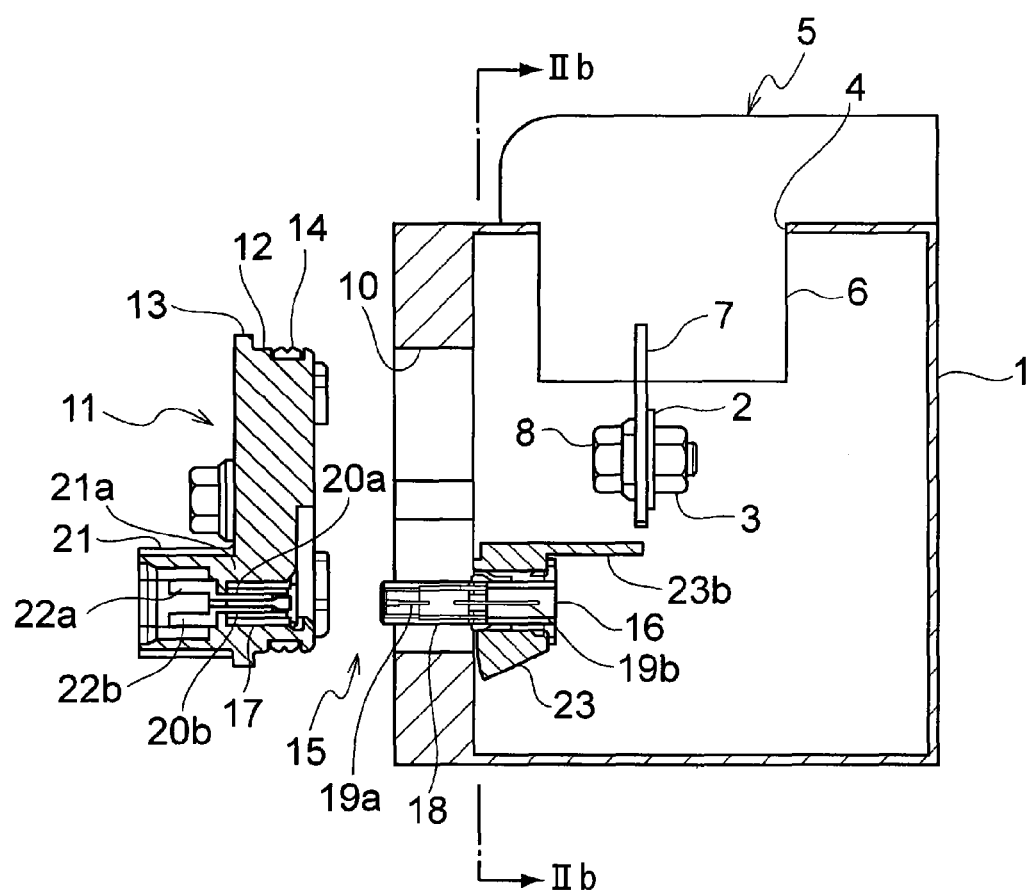
FIG. 1 is a sectional view of main portions of an embodiment of an electric device according to the invention.

Hereinafter, an electrical component device according to the invention will be described with reference to an embodiment shown FIGS. 1 to 4C. In the embodiment, the invention is applied to a power distributor. The figures are views showing main portions of the embodiment. The invention may be applied not only to a power distributor but also to an electric device having a configuration where a work of connecting external conductors which are inserted from the outside, to internal conductors of an electric component such as an inverter accommodated in a case is performed by using fastening members introduced through an assembly work opening disposed in a wall of the case. Particularly, the invention may be applied to an electric device including a fitting detecting mechanism which, when the assembling work is ended, detects that the protective cover is fitted to the assembly work opening.

As shown in FIGS. 1 to 3B, the power distributor in the embodiment includes a case 1 made of a synthetic resin or the like. In the embodiment, the case 1 is formed into a parallelepiped box-like shape. However, the shape of the case 1 is not limited to that in the embodiment. Electric circuit components which are unillustrated electric components are accommodated in the case 1. A pair of bus bars 2 which are internal conductors are connected to the unillustrated electric components. Through holes which are not shown are formed in the bus bars 2, respectively. Nuts 3 which correspond to fastened members are fixed to the right sides of the through holes in the figures. An opening 4 is formed in the upper wall of the case 1. A terminal holding portion 6 of an external connector 5 which is connected to a power supply that is not shown can be inserted and attached to the opening 4. Although not illustrated, a portion where the external connector 5 is attached to the opening 4 is waterproofed by a waterproof packing or the like.

A pair of connector terminals 7 which are external connectors vertically downwardly extend from the lower surface of the terminal holding portion 6 of the external connector 5. Through holes through which bolts 8 functioning as fastening members are to be passed through are formed in the connector terminals 7. When the bolts 8 are screwed to the nuts 3, the bus bar 2 are fastened and electrically connected to the respective connector terminals 7.

The assembly work opening 10 is formed in a wall of the case 1 opposed to the fastened portions where the bus bars 2 and the connector terminals 7 are fastened to each other. A work of inserting the bolts 8 into the trough holes of the bus bars 2 and the connector terminals 7, and screwing the bolts into the nuts 3 is performed through the assembly work opening 10, thereby conducting the work of fastening these members together. The assembly work opening 10 is configured so that a protective cover 11 which is made of an insulating resin can be attached to the assembly work opening in order to prevent a tool or the like from being erroneously contacted with the bus bars 2 or the connector terminals 7 to cause a short circuit failure, or to obtain a waterproof structure.

Figure 3A:
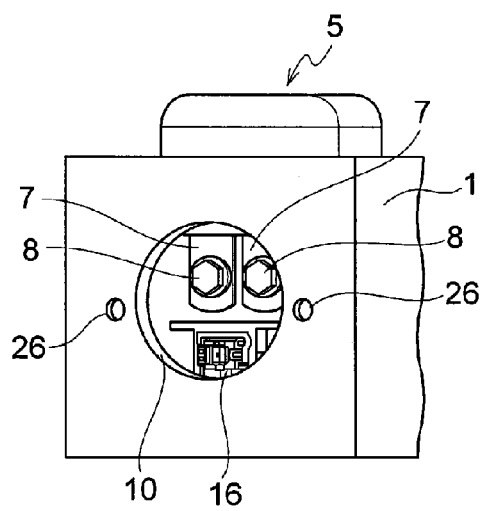
FIGS. 3A and 3B are external views illustrating the procedure of assembling the embodiment of FIG. 1.
Figure 3B:
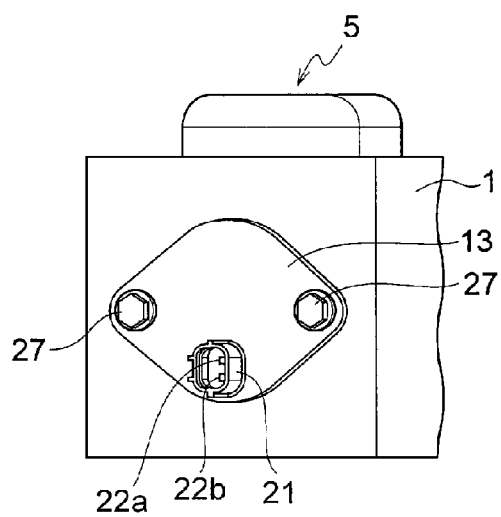

As shown in FIG. 3A, the assembly work opening 10 is formed as a circular opening. To comply with this, the protective cover 11 includes a cylindrical inserting portion 12, and a rhombic flange 13 which is disposed continuously with the inserting portion 12. A waterproof ring packing 14 is attached into a groove which is formed in the outer circumferential surface of the inserting portion 12. A fitting detecting connector 15 which detects that the protective cover 11 is attached to the assembly work opening 10 is disposed in a lower portion of the protective cover 11 in the figure.

Figure 2A:
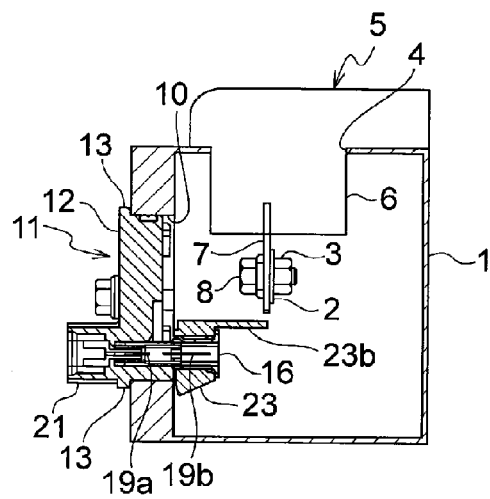
FIGS. 2A and 2B are views illustrating the procedure of assembling the embodiment of FIG. 1.

The fitting detecting connector 15 is formed by a pair of connectors which are fittable to each other, or namely by a receptacle connector 16 which is fixed to the interior of the case 1, and an insertion/extraction connector 17 which is disposed in the protective cover 11 in a mutually insertable/extractable manner while being opposed to the receptacle connector 16. In the receptacle connector 16, a pair of pin-like fitting detecting conductors 19a, 19b are accommodated in the axial direction in a cylindrical housing 18, and the front end into which the insertion/extraction connector 17 is insertable and extractable is opened. The insertion/extraction connector is formed integrally with the inserting portion 12 of the protective cover 11. The insertion/extraction connector 17 includes: a pair of detecting electrodes 20a, 20b which are insert molded with a hood portion 21a that is formed by partitioning the space of a cylindrical housing 21 in the longitudinal direction; and a pair of detecting terminals 22a, 22b which are coupled to the pair of detecting electrodes 20a, 20b in the hood portion 21a, respectively. The pair of detecting terminals 22a, 22b that are drawn out from the hood portion 21a are held in the cylindrical housing 21 in which the front end is opened. Namely, one ends of the pair of detecting electrodes 20a, 20b are connected respectively to the external terminals 22a, 22b which are located in a space formed in the cylindrical housing 21 of the insertion/extraction connector 17. A signal wire connector shown in FIG. 4A covers the front end of the opening housing 21, whereby terminals accommodated in the signal wire connector 30 are caused to be connected to the external terminals 22a, 22b, respectively. A fitting detection signal is led out through wires 32 connected to the terminals. When the protective cover 11 is fitted to the assembly work opening 10 as shown in FIG. 2A, namely, the insertion/extraction connector 17 is fitted to the receptacle connector 16. As a result, the pair of detecting electrodes 20a, 20b are caused to be electrically conductive with each other by the fitting detecting conductors 19a, 19b, and a signal indicative of the conduction is led out to the outside as the fitting detection signal through the external terminals 22a, 22b.

Figure 4A:
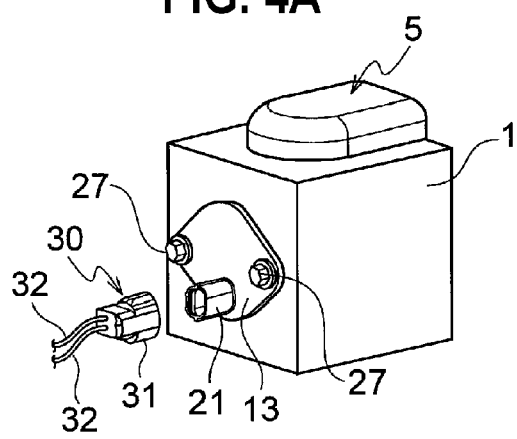
FIGS. 4A to 4C are views showing an embodiment of a signal wire connector for fitting detection.
Figure 4B:
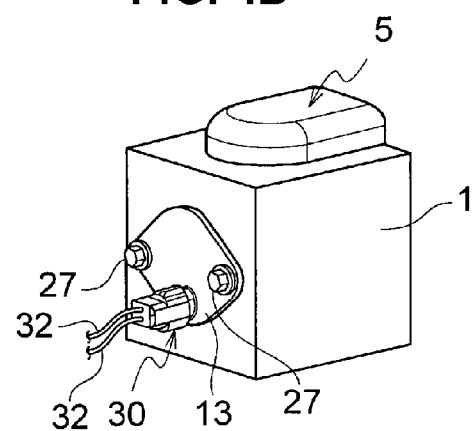
Figure 4C:
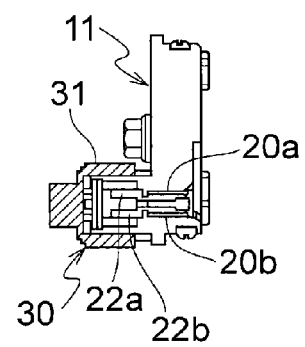

As shown in FIG. 4A, the signal wire connector 30 includes a hood portion 31 which is to cover the outer circumferential surface of the housing 21 of the insertion/extraction connector 17. A pair of wiring terminals to which signal wires are connected are accommodated in the hood portion 31. The pair of wiring terminals are configured so as to be connected to the pair of external terminals 22a, 22b functioning as the pair of detecting terminals, when the signal wire connector 30 is fitted to the housing 21.

Figure 2B:
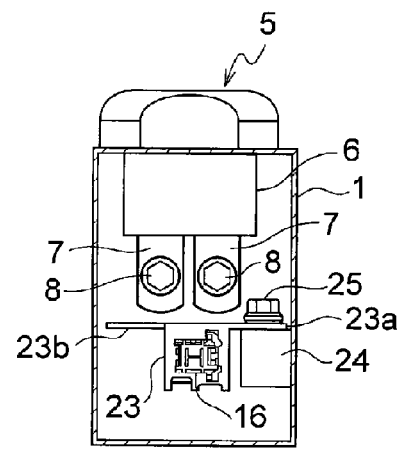

As shown in FIG. 2B, the basal portion of the housing in which the fitting detecting conductors 19a, 19b of the receptacle connector 16 are accommodated is attached to a receptacle connector holding member 23 that is formed into a rectangular tubular shape. The receptacle connector 16 is supported by fixing a supporting piece 23a which is projected from the upper surface of the receptacle connector holding member 23, to a supporting member 24 fixed to the inner side wall of the case 1. In the receptacle connector holding member 23, as shown in FIGS. 1, 2A, and 2B, a protruding portion 23b is formed to protrude below the pair of bus bars 2 and the pair of connector terminals 7.

According to the thus configured embodiment, referring to FIGS. 1 to 4C, the receptacle connector 16 is fixed to the supporting member 24, and the external connector 5 is attached to the case 1 while positioning the connector terminals 7 with respect to the bus bars 2. Then, the bolts 8 are introduced through the assembly work opening 10, inserted into the through holes of the connector terminals 7 and the bus bars 2, and screwed and fastened to the nuts 3. As a result, the connector terminals 7 and the bus bars 2 can be fastened together by co-fastening. Even when one of the bolts 8 drops during the fastening operation, the bolt can be received by the protruding portion 23b, and does not drop on the bottom of the case 1, and therefore the bolt can be easily recovered. After the connector terminals 7 and the bus bars 2 are fastened together, the insertion/extraction connector 17 is fitted to the receptacle connector 16 at the same time when the protective cover 11 is fitted to the assembly work opening 10. As shown in FIGS. 3A and 3B, then, bolts 27 are screwed into the flange 13 and bottomed screw holes 26 formed in the outer wall of the case 1, and the protective cover 11 is fixed to the case 1. When the protective cover 11 is fitted to the assembly work opening 10, the fitting detection signal is supplied from the external terminals 22a, 22b of the fitting detecting connector 15 to, for example, the power supply side through the signal wire connector 30. After confirming safety, a power supply of the power distributor of the embodiment is enabled.

According to the embodiment, as described above, the fitting detecting connector 15 which detects that the protective cover 11 is fitted to the assembly work opening 10 is divided into the receptacle connector 16 and the insertion/extraction connector 17, the receptacle connector 16 is accommodated in the cylindrical housing 18, and the insertion/extraction connector 17 is disposed on the protective cover 11. When the protective cover 11 is fitted to the assembly work opening 10 while performing positioning between the receptacle connector 16 and the insertion/extraction connector 17, therefore, the insertion/extraction connector 17 is automatically fitted to the receptacle connector 16. As a result of this fitting, the pair of detecting electrodes 20a, 20b of the insertion/extraction connector 17 are electrically conductive with the pair of fitting detecting connector 19a, 19b of the receptacle connector 16, thereby causing the pair of detecting electrodes 20a, 20b to be electrically conductive with each other. When signal wires are connected to the pair of external terminals 22a, 22b of the insertion/extraction connector 17 through the signal wire connector 30, therefore, the wires can be easily drawn out to the outside through the protective cover 11 fitted to the assembly work opening 10, without requiring formation of a hole for the signal wires in the wall of the case.

According to the embodiment, moreover, the case 1 can be waterproofed and dustproofed by the hood portion 21a of the insertion/extraction connector 17. Furthermore, the waterproofing and dustproofing of the portion where the protective cover 11 is fitted to the assembly work opening 10 can be performed by the packing 14.

Although the invention has been described with reference to the embodiment, it is obvious to a person skilled in the art that the invention is not limited to the embodiment, and can be made in a mode which is modified or changed within the spirit of the invention. It is a matter of course that the modified or changed mode falls within the scope of the appended claims.

What is claimed is:

1. A protective cover structure comprising:
   a protective cover that is fitted to an assembly work opening disposed in a wall of a case in which electric components are accommodated, thereby closing the opening; and
   a fitting detecting connector that detects that the protective cover is fitted to the assembly work opening,
   wherein the fitting detecting connector includes a receptacle connector which is fixed to an interior of the case and an insertion/extraction connector which is disposed on the protective cover in a mutually insertable/extractable manner while being opposed to the receptacle connector,
   the receptacle connector includes a first tubular housing and fitting detecting conductors in the first tubular housing, and
   the insertion/extraction connector holds a pair of detecting electrodes which are electrically conductible with the fitting detecting conductors, and is molded integrally with the protective cover,
   wherein the first tubular housing extends into the assembly work opening and projects outwardly from the case in a direction toward the protective cover when fitted to the assembly work opening,
   wherein the insertion/extraction connector includes a second tubular housing in which the pair of detecting electrodes are held by a hood portion that is disposed by partitioning a tubular housing space in a longitudinal direction and a pair of detecting terminals connected to the pair of detecting electrodes and drawn out from the hood portion are accommodated, and
   the second tubular housing of the insertion/extraction connector is formed so that a signal wire connector which is detachably connected to the pair of detecting terminals covers a front end of the second tubular housing.

2. The protective cover structure according to claim 1, wherein the second tubular housing projects from the rear face of the protective cover in a fitting direction between the protective cover and the assembly work opening.

* * * * *